United States Patent
Hillis et al.

(10) Patent No.: US 8,326,552 B2
(45) Date of Patent: Dec. 4, 2012

(54) REDUNDANT AND FAULT-TOLERANT POWER DISTRIBUTION SYSTEM HAVING AN INTEGRATED COMMUNICATION NETWORK

(75) Inventors: W. Daniel Hillis, Encino, CA (US); Anthony N. Gardner, Las Vegas, NV (US); Russel Howe, Montrose, CA (US); Randall Adam Yates, Ventura, CA (US)

(73) Assignee: Applied Minds, LLC, Glendale, CA (US)

(\*) Notice: Subject to any disclaimer, the term of this patent is extended or adjusted under 35 U.S.C. 154(b) by 531 days.

(21) Appl. No.: 12/548,724

(22) Filed: Aug. 27, 2009

(65) Prior Publication Data
US 2010/0057386 A1 Mar. 4, 2010

Related U.S. Application Data

(60) Provisional application No. 61/092,690, filed on Aug. 28, 2008.

(51) Int. Cl.
*G01R 31/00* (2006.01)
(52) U.S. Cl. .................................................. 702/58
(58) Field of Classification Search .................. 702/58
See application file for complete search history.

(56) References Cited

U.S. PATENT DOCUMENTS
2002/0064010 A1\* 5/2002 Nelson et al. ............... 361/64
\* cited by examiner

*Primary Examiner* — Cindy H Khuu
(74) *Attorney, Agent, or Firm* — Michael A. Glenn; Glenn Patent Group

(57) ABSTRACT

A power distribution and communication system includes nodes connected by power lines and communication links. The system receives power from one or more power sources. Each node contains at least one power port, data port and load port. Associated with each power port and load port is a port monitor for measuring current flowing into or out of the port and the voltage difference between the port outlet and ground, which measurements are passed to a processing element. The processing element and monitor analyze measured values to detect fault conditions. Upon fault condition detection, the port is disabled by opening a switch, disconnecting the port from the system voltage. The processing element receives power directly from the power line, thus receiving power from a live power line even if the associated power port is disabled allowing the processing element to enable a disabled node following a failure.

40 Claims, 4 Drawing Sheets

REDUNDANT AND FAULT-TOLERANT POWER DISTRIBUTION SYSTEM HAVING AN INTEGRATED COMMUNICATION NETWORK

CROSS REFERENCE TO RELATED APPLICATIONS

This Application claims benefit of U.S. provisional patent application Ser. No. 61/092,690, filed Aug. 28, 2008, which is incorporated herein in its entirety by this reference thereto.

BACKGROUND OF THE INVENTION

1. Technical Field

The invention generally relates to power distribution systems and communication networks. More particularly, the invention relates to a redundant and fault-tolerant combined power distribution system and communication network.

2. Background Description

A primary objective for any power distribution system or communication network is to minimize the likelihood of a loss of function in the event of a failure. While strategic routing and shielding of physically durable wiring can minimize the likelihood of a failure, fault tolerant systems are clearly advantageous if functionality is to be preserved when a failure (inevitably) occurs.

Power distribution systems and communication networks are subject to a wide variety of failure conditions, but primary among these are:

Break: a complete severing of the wire carrying the power or communications signal;

Full Short: a low-resistance, non-intermittent connection either to ground (in the case of a power distribution system) or to ground or between a differential pair (in the case of a communication network);

Partial Short: a relatively high-resistance or intermittent connection either to ground (in the case of a power distribution system) or to ground or between a differential pair (in the case of a communication network).

In the case of a conventional power distribution system, a break results in a loss of power to all devices "downstream" of the cut. Similarly, a full short removes power from downstream devices, and may additionally damage devices with inadequate current overload protection. A partial short can cease device function, lead to erratic device function, or damage one or more devices.

The importance of addressing such failures is increasing with the more frequent deployment of higher voltage power distribution systems, such as the move from 12- to 42-volt vehicle power distribution systems. For example, a higher voltage system is much more likely to support an arc between exposed wiring and the vehicle chassis, creating a short to ground. Similarly, an increased hazard is presented by in-line arcs across severed wires which are carrying current.

In the case of a communications network, such as a conventional Controller Area Network (CAN-bus), a break separates the bus into two improperly terminated segments. Communication between devices on opposing sides of the cut is no longer possible. Reflection associated with the improper termination may even inhibit communication between devices within one segment. A full short, either to ground or between a differential pair, effectively pulls the logic values to zero, rendering all communication on the bus impossible. A partial short also renders communication problematic if not impossible, and may even result in the introduction of spurious data.

SUMMARY

A power distribution and communication system includes nodes connected by power lines and communication links. The system receives power from one or more power sources. Each node contains at least one power port, data port and load port. Associated with each power port and load port is a port monitor for measuring current flowing into or out of the port and the voltage difference between the port outlet and ground, which measurements are passed to a processing element. The processing element and monitor analyze measured values to detect fault conditions. Upon fault condition detection, the port is disabled by opening a switch, disconnecting the port from the system voltage. The processing element receives power directly from the power line, thus receiving power from a live power line even if the associated power port is disabled, allowing the processing element to enable a disabled node following a failure.

DETAILED DESCRIPTION

A power distribution and communication system includes nodes connected by power lines and communication links. The system receives power from one or more power sources. Each node contains at least one power port, data port and load port. Associated with each power port and load port is a port monitor for measuring current flowing into or out of the port and the voltage difference between the port outlet and ground, which measurements are passed to a processing element. The processing element and monitor analyze measured values to detect fault conditions. Upon fault condition detection, the port is disabled by opening a switch, disconnecting the port from the system voltage. The processing element receives power directly from the power line, thus receiving power from a live power line even if the associated power port is disabled, allowing the processing element to enable a disabled node following a failure.

System Overview

Figure 1:
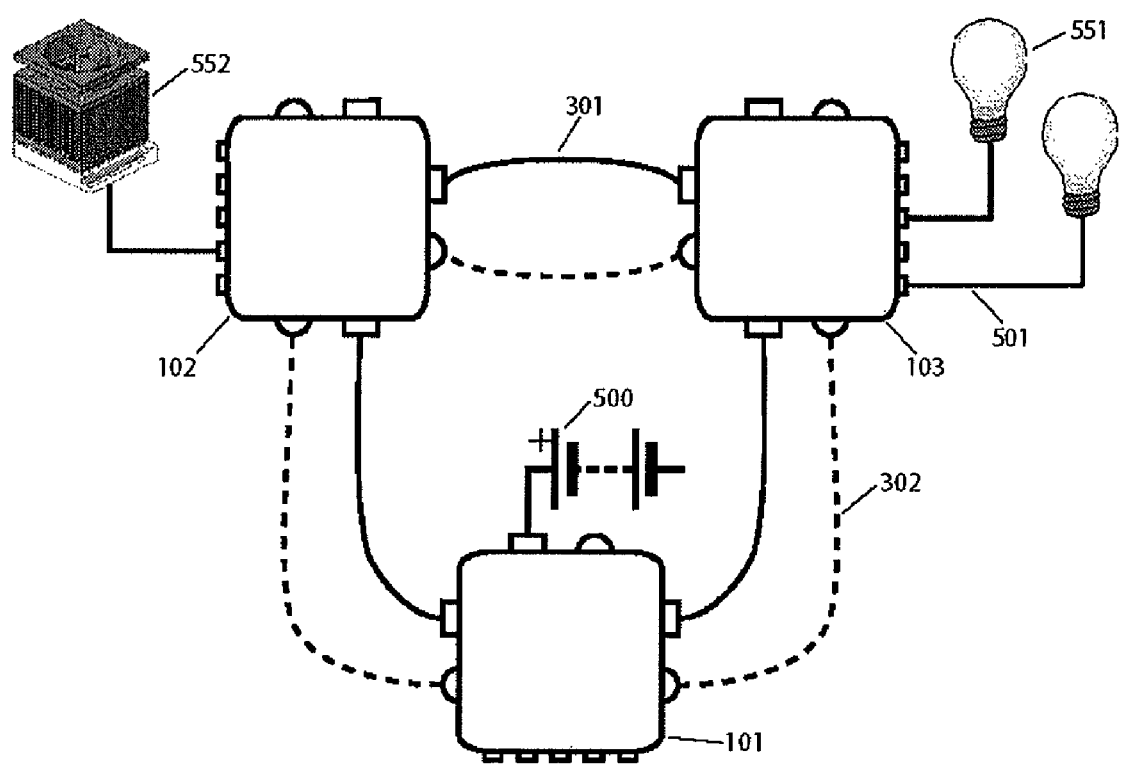
FIG. 1 shows an exemplary combined power distribution and communication system.

FIG. 1 shows an exemplary combined power distribution and communication system according to the invention. In this exemplary configuration, three nodes 101, 102, 103 are connected in a simple loop topology. Power flows bi-directionally between the nodes along power lines 301. A power source, such as a battery 500, provides power to the system via one of the nodes 101. Devices consuming power, for example, two lights 551 and a fan 552 are connected to nodes 102 and 103 by load lines 501. Data passes bi-directionally between the nodes along communication links 302. The data passed on the communication links may be used to enable or disable power sources and devices.

Optionally, the communication links can pass higher level (application-specific) data. For example, they may pass data obtained by a sensor or rate control information for an actuator.

It will be noted that each power and load line shown in FIG. 1 may in fact correspond to a pair of wires if a ground reference wire is to be routed to each node and device, though a single wire may be used if a reliable ground reference, such as a chassis ground, is available to each node and device. Similarly, the communication links shown may represent a pair of wires over which data is transmitted in the form of a voltage differential between the wires. Alternatively, the communication link may constitute optical fiber so as to minimize the likelihood of electromagnetic interference. Thus, the communication network may be based on any one of several well known standards such as RS-485, Ethernet, or CAN-Bus, each of which standards is herein incorporated in its entirety by this reference thereto as if fully set forth herein.

Figure 2:
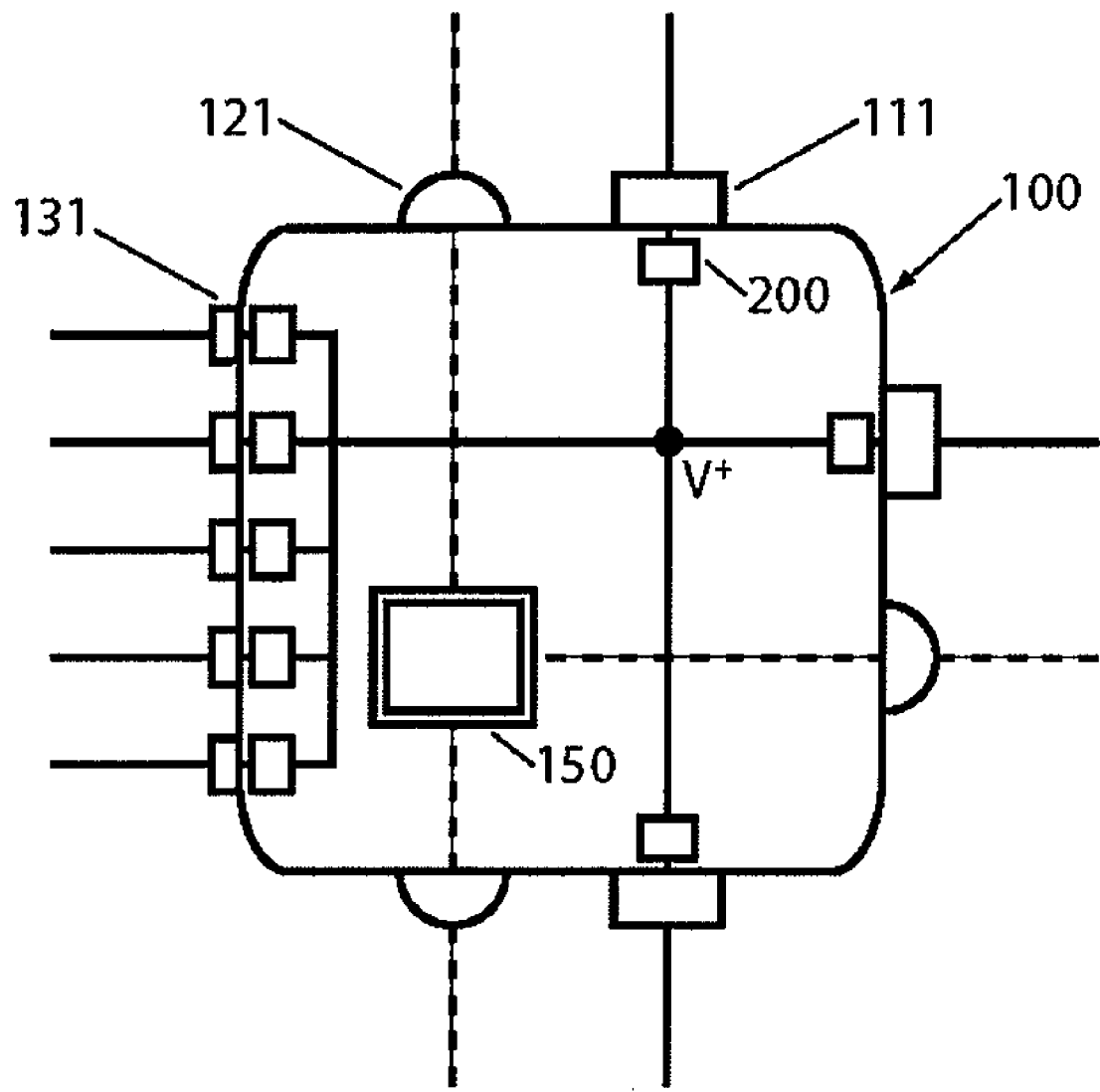
FIG. 2 shows a schematic of a node according to one embodiment.

FIG. 2 shows a schematic of a node according to an embodiment. Each node 100 contains at least one power port 111 and at least one data port 121. In one embodiment, each node also contains at least one load port 131. In the embodiment of FIG. 2, each node contains three power ports, three data ports, and five load ports. As shown in FIG. 1, the power ports and data ports receive the power lines 301 and communication links 302, respectively, connecting the node to other nodes. A power port may alternatively accept power from a power source. The load ports receive load lines connecting power consuming devices to the node. Not all load ports need be utilized at each node; in some cases, such as node 101 in FIG. 1, no load ports are utilized at all. During normal operation, each power port and load port is connected to the system voltage $V^+$, e.g. 42 V.

Associated with each power port and load port is a port monitor 200. The port monitor measures the current flowing in or out of the port. Additionally, the port monitor measures the voltage difference between the port outlet and ground. These measurements are passed to a processing element such as a processor, microcontroller or other integrated circuit having processing capability 150. The processing element and port monitor collectively analyze the measured values to detect one or more fault conditions. If a fault condition is detected, the port is disabled by opening a switch to disconnect the port from the system voltage level. Power is provided to the processing element directly from the power line. That is, the processing element can still receive power from a live power line even if the associated power port is disabled. As described in greater detail below, this allows the processing element to enable a disabled node following a failure.

Voltage and Current Monitoring

Figure 3:
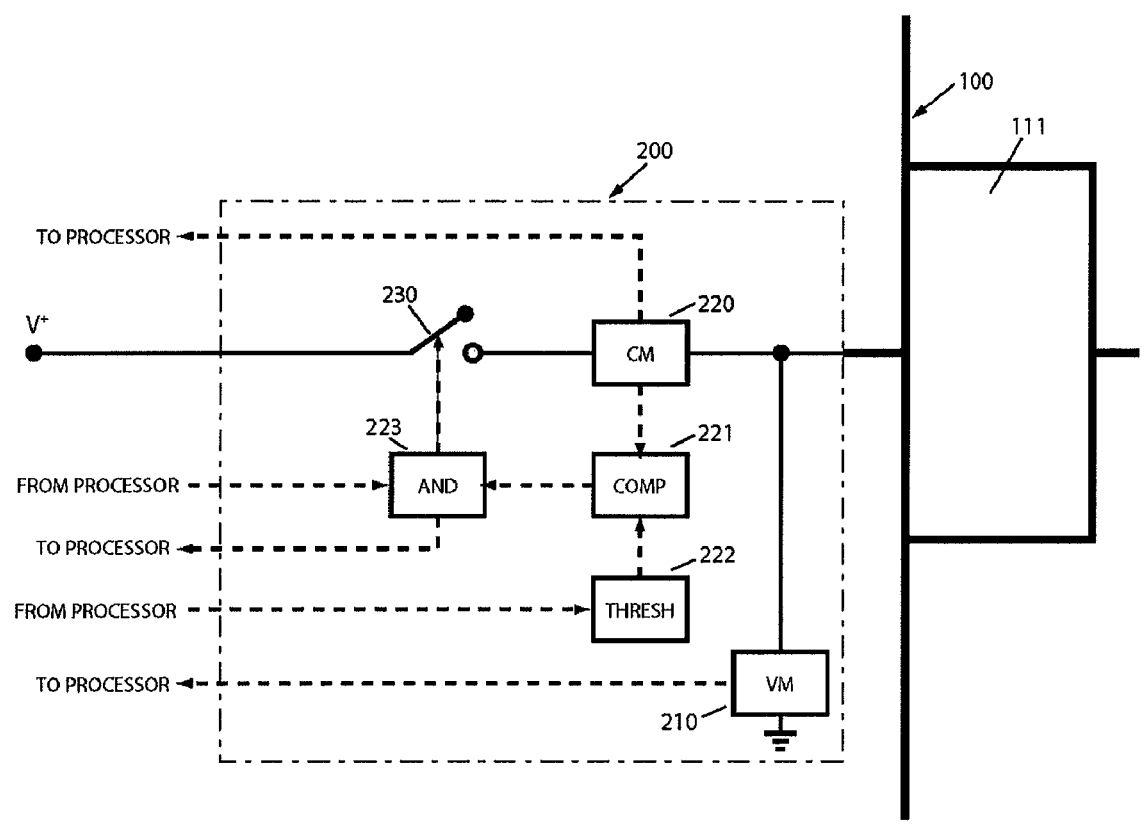
FIG. 3 shows a schematic of a port monitor.

FIG. 3 shows a schematic of a port monitor. Within the monitor is a switch 230, such as a FET (field effect transistor) or other comparable circuit, which is closed under normal operation but, when open, disables the port 111 associated with the port monitor. A voltage monitor 210 measures the difference between the voltage at the port 111 and ground (equal to either zero or $V^+$ under normal operation) to verify the operation of the switch. A current monitor 220 measures the current flowing into or out of the port. A comparator 221 compares the value of the measured current against a threshold value 222 supplied by the processing element. If the associated port is a power port, the comparator considers the absolute value of the measured current, allowing for the bidirectional nature of the current flow between nodes. If the associated port is a load port, the comparator considers the value of the outgoing current. The measured voltage, measured current, and result of the comparison operation are supplied to the processing element for analysis. The switch is controlled by an AND operator 223, such that the switch is closed only upon approval; in other words, positive values; from both the processing element and comparator. The port may thus be disabled either locally (by the comparator) or remotely (by the processing element).

Power Fault Tolerance

Loop Topology (Break)

As shown in FIG. 1, the connectivity of the nodes readily supports configuration in a loop topology. The loop topology provides a fundamental advantage over many conventional power distribution systems in that, should a power line be broken, the bidirectional nature of the power flow ensures that power still reaches all nodes. Additionally, should an intermittent break open in a power line, the voltage drop across the break (potential arc voltage) is a function of the in-line resistance around the loop. Because this resistance is minimal, the potential for in-line arcing is negligible.

Local Port Disablement (Full Short)

If the current monitor measures a current, either into or out of the associated port, that exceeds a threshold value set by the processing element, the comparator sends a zero value to the AND operator to open the switch and disable the port. Thus, if a full short to ground arises in the power line or in a device connected to the associated port, the current monitor detects the resulting increase in current and the port is disabled. Because this disablement occurs locally, the delays and complexity associated with processing element analysis are avoided. The resulting response time is sufficiently rapid to avert damage to any connected devices. In practice, response times as fast as 200 μsec can be attained. If the disabled port is a load port, the other load ports are unaffected. If the disabled port is a power port, power can still reach each all nodes on account of the loop topology described above.

For port monitors associated with load ports, the threshold value 222 may vary in time. In particular, the processing element may supply a threshold allowing an elevated current level for a short period of time following the closure of the switch within the port monitor (and the enabling of the attached device). This ensures that the current monitor will not routinely disable the port for loads, such as incandescent bulbs, that draw a briefly-elevated current (an "in-rush" current) upon closure of the switch. The threshold may be linearly ramped downward from an initially-elevated level or may follow a function that characterizes the activation behavior of the particular device connected to the load port more precisely.

Coordinated Port Disablement (Partial Short)

As noted above and shown in FIG. 3, the current measurements obtained at each port monitor are passed to the processing element within the node. Additionally, as shown in FIG. 2, the processing element 150 is connected to each of the communication links to neighboring nodes. The processing element can thus pass the current measurements to and receive current measurements from neighboring nodes. By comparison of the current exiting one node to the current entering the neighboring node, which quantities are equal under normal operating conditions, a partial short—a high resistance "leak" to ground—can be detected. The processing element can thus detect partial shorts that may not necessarily lead to an increase in current flow sufficient to trigger local port disablement. If such a condition is detected, the processing element disables the port by sending a zero value to the AND operator.

Recovery from Failure

Also provided is a set of procedures for recovering from failures. The recovery procedures may be used independently of or in combination with one another.

In one procedure, after one or more ports have been disabled, each processing element attempts to reestablish the flow of power to and from adjacent nodes by closing the switches within any disabled power ports; which is effected by resetting the input values of the AND operators associated with the switches to '1'. As each switch is closed, the current monitor monitors the current flowing through the port. If the current remains below the threshold specified by the processing element, it is determined that current is not flowing through the power port to ground through a full short, and the switch remains closed. If the current exceeds the threshold, the port is again disabled. A timer operating on the processing element may be used to trigger subsequent attempts at enabling the port, and a counter may be used to limit the number of attempts made. Following successful closure of any disabled power ports, any disabled load ports are enabled in a similar manner, with the current monitors checking for any excessive current draws upon closure of the switches associated with the load ports.

Optionally, upon closure of each switch, the processing element (via the voltage monitor) may compare the voltage differential between the port and ground to the system voltage $V^+$. The voltage differential, in conjunction with the current measured by the current monitor, can be used to detect a high-resistance condition across the switch. If a high-resistance condition, indicative of damage to the switch during the failure, is detected, the switch is opened and the port disabled.

The above procedures are useful for enabling ports disabled in response to unforeseen, transient phenomena that are not actually associated with a failure or in response to true failures that have been repaired by an operator of the system. The procedures provide a relatively simple mechanism for safely restoring full system function when one or more load or power ports have been disabled following such a temporary failure.

Additionally, in recovering from a failure, a processing element may monitor (via the voltage monitor) the voltage at each disabled port. If the processing element detects that the voltage at the port matches the system voltage $V^+$, it infers that the power line leading to the port is healthy, i.e. free of a full short to ground, and accordingly enables the power port. If the timer (described above) used to trigger subsequent attempts at enabling ports is of long duration, this approach can substantially speed the rate of system recovery. It also allows a user to restore power distribution after a temporary failure by manually instructing one node to enable its power ports. Other nodes enable their power ports in response, as the power distribution system heals in an outward fashion.

In other instances, a more persistent failure may not allow for the system to return to full functionality. In these cases, a recovery procedure for restoring as much functionality as possible is provided, given the location of the persistent failure.

When a failure, such as full short to ground, occurs, one or more of the power ports along each pathway between each power source and the failure are disabled. Thus, following the failure, only a fraction of the processing elements within the power distribution system have power—those processing elements in nodes connected to power sources and those processing elements in nodes linked to power sources via power ports that remain enabled.

To recover from the failure, each of the powered processing elements first attempts to enable any disabled load ports. If the load ports are enabled successfully, the processing element attempts to enable any disabled power ports. Initially, the processing element enables each disabled power port with a current threshold just above that needed to power the processing element at any neighboring node connected to the power port. The low current threshold is maintained for a period of time shorter than the expected boot time of the neighboring processing element, after which it is returned to the typical threshold value. If the line leading from the enabled port to the neighboring node is compromised, i.e. it contains the failure, the current threshold is exceeded and the power port is once again disabled. The restart procedure may be attempted again, but a flag or counter within the processing element ensures that the recovery procedure is not attempted continually. If the line leading from the enabled port to the neighboring node is intact, i.e. the failure is elsewhere, the neighboring processing element detects that it has received power on one of its power ports, and, itself, begins the recovery procedure. Similar to the procedure described above, the power distribution system heals outwardly from those nodes with processing elements powered immediately after the failure.

Eventually, a node attempts to enable the port (either a load port or power port) associated with, i.e. directly connected to the line containing, the failure. If the port associated with the failure is a load port, the current threshold is exceeded and the port again disabled. As with the power ports, a flag or counter ensures that the recovery procedure is not attempted continually.

All other load ports and power ports are enabled and system function (apart from the device on the offending load port) is restored. If the port associated with the failure is a power port, the failure draws current in excess of both the temporarily low threshold in the enabling node and the typically higher threshold in the nodes that either remained enabled through failure or have already successfully recovered after failure. However, because the current increases over a finite rise time, the temporarily low threshold is exceeded before the typical threshold. The enabling node disables the power port associated with the failure before any other nodes disable any other power ports. The temporarily-low threshold thus ensures that, upon recovery, the system does not merely return to the system state immediately following the initial failure. Rather, full system function is restored "up to the location of the failure".

Communications Fault Tolerance

The loop topology provides benefits to the communications links similar to those of the power distribution system. Specifically, should a communication link be cut or fully shorted, the bidirectional nature of the data flow ensures that data still reaches all nodes. In monitoring the data received over each data port, the processing element can also provide communications network fault tolerance. For example, if the data received from a neighboring node is zero-valued for an extended period of time, the processing element may infer the presence of a short in the communication link connecting to the neighboring node and disable the corresponding data port. As noted, data can still be received from the neighboring node by traversing the complementary pathway within the loop topology.

Device Diagnostics and Communication Integration

The sharing of data between adjacent nodes also provides an opportunity for system and device diagnostics. One or more nodes within the system can be connected to a separate network and report the location of system failures such as breaks or shorts in power or communications lines.

Such information can save time and effort in remedying a failure. Similarly, the system can report diagnostics for the connected devices. At minimum, the system can detect the failure of a device by monitoring the current drawn by the device. Optionally, the system may be connected to an external network, either onboard or off board the vehicle, e.g. a wireless network, allowing for remote diagnostics of system and device function.

Variations
Alternate Topologies

The example shown in FIG. 1 illustrates one exemplary system design in which each node serves as either a power source, i.e. node 101, or a power sink, i.e. nodes 102 and 103, and the nodes are connected in a single loop topology. The invention is not restricted to such topologies, and indeed the invention provides a great range of flexibility in configuring nodes, power sources, and devices.

For example, it is possible for a single node to be connected to a power source and one or more loads. The network may also contain more than one power source. Additionally, the number and types of ports on each node may vary as well. Generally, nodes have an equal number of communication and power ports. Similarly, the number of power lines and communication links connecting two neighboring nodes is generally the same, with connections serving high-priority devices requiring a higher level of fault tolerance having more than one power line and communication link. However, power and bandwidth requirements may also be considered. For example, a node serving a low-priority device requiring high bandwidth but little power may be connected with several communication links and a single power line. The number of connections between neighboring nodes may also be adjusted in light of the location of the physical pathway between the nodes and the likelihood and nature of any anticipated structural damage.

The system may also be extended by adding connections between nodes to create a limited mesh topology for either power or communication. In this approach, multiple failures may be tolerated depending on the specific mesh topology and the location and number of power sources within the system and the specific communication requirements of the devices within the network. Finally, while each device is generally connected to a load port on a single node, it is possible to connect especially high-priority devices to more than one node to provide additional reliability.

Voltage Monitor Short Detection

Figure 4:
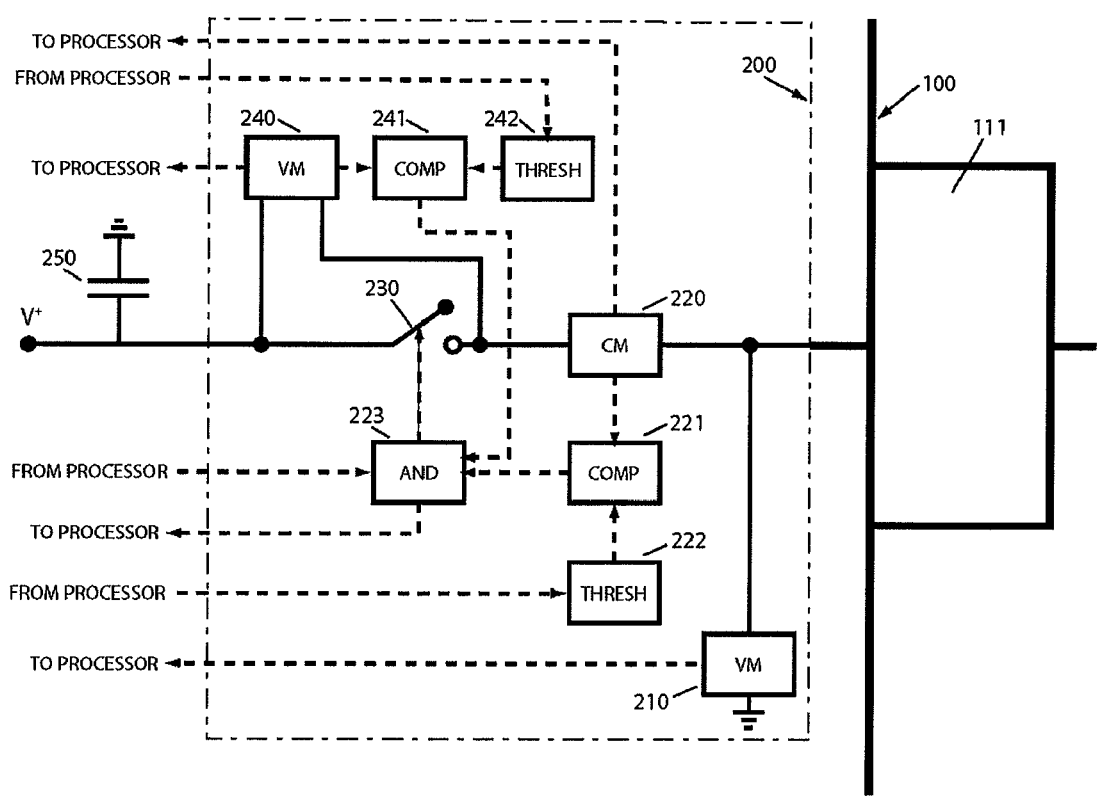
FIG. 4 shows a schematic of a port monitor that incorporates an additional voltage monitor to aid in detecting failures.

FIG. 4 shows a schematic of a port monitor incorporating an additional voltage monitor to aid in detecting failures. The second voltage monitor 240 monitors the voltage differential across the switch 230. A comparator 241 compares the measured voltage to a threshold 242 provided by the processing element. If the measured voltage exceeds the threshold value, the comparator opens the switch and disables the port by sending a zero value to the AND operator.

In the event of a full short to ground, the abnormally high current through the switch will result in a correspondingly large voltage drop across the (small, but non-zero resistance) switch. The second voltage monitor thus provides an alternative to current monitoring in detecting failures and disabling the port in response. While FIG. 4 depicts an embodiment incorporating both a current monitor 220 and a second voltage monitor 240, other embodiments may use the second voltage monitor in place of the current monitor.

As noted above, in embodiments in which the ports are disabled by current monitors, multiple ports may be disabled in response to a single full short to ground. To minimize this effect, an embodiment incorporating a second voltage monitor may also incorporate a capacitor 250 leading from the system voltage $V^+$ to ground. The capacitor serves to momentarily shield the nodes further from the failure from the initial rise in current following the failure. This ensures that the second voltage monitor(s) in port monitors immediately adjacent to the point of failure detect the excessive voltage before those voltage monitors in port monitors further from the point of failure. This greatly reduces the number of ports disabled following a failure—in most system topologies, only two ports are disabled—greatly simplifying and shortening the recovery procedure following failure.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

The invention claimed is:

1. A power distribution system having an integrated communication network comprising:
   a plurality of nodes connected in a topology that enables current to flow bi-directionally between said nodes, said nodes additionally serviced by communication links therebetween for conducting data bi-directionally between said nodes;
   each node comprising:
     at least one port and an associated port monitor for measuring current flow into and out of said port; and
     a processing element, wherein said processing element and port monitor analyze the measured current to detect one or more fault conditions and, responsive to detection of said one or more fault conditions, reversibly disable said port;
   wherein said port monitor comprises:
     a switch that is closed under normal operation and, when open, disables said port;
     a current monitor for measuring current flowing into or out of said associated port; and
     a comparator for comparing a value of said measured current against a threshold value;
     wherein said switch is controlled by an AND gate such that said switch is closed only upon positive input to said AND gate from both said processing element and said comparator, so that said port is disabled either locally by said port monitor or remotely by said processing element.

2. The system of claim 1, wherein said processing element comprises a processing element programmed for varying said threshold value for port monitors associated with load ports over time by any of:
   ramping said threshold value down from an initial value; and
   following a function that characterizes activation behavior of a particular device.

3. The system of claim 1, wherein said processing element comprises a processing element programmed for:
   passing and receiving current measurements over said communication links to and from at least one neighboring node;
   detecting at least one fault condition by comparing current measurements at said associated port with current measurements received from at least one of said at least one neighboring node; and
   disabling any port associated with said at least one fault condition by sending a zero value to said AND gate.

4. The system of claim 1, said processing element comprising a processing element programmed for, responsive to one or more ports having been disabled, attempting to re-establish power flow to and from adjacent nodes by closing switches within port monitors associated with any disabled power ports, wherein as each switch is closed, said current monitor monitors current flowing through its associated port, and wherein if said current remains below a specified threshold, said at least one switch is kept closed, and wherein, if said current exceeds said specified threshold, said at least one port is again disabled.

5. The method of claim 4, wherein said processing element programmed for attempting to re-establish power flow is further programmed for any of:
triggering successive attempts at enabling at least one of said disabled ports by means of a timer;
limiting a number of attempts at enabling said at least one of said disabled ports by means of a counter;
responsive to successful enabling of any disabled power ports, enabling disabled load ports; and
responsive to closure of each switch, comparing a voltage differential between an associated port and ground to a system voltage, wherein said voltage differential in conjunction with said measured current is used to detect a high-resistance condition across the switch, and responsive to detection of said high-resistance condition, indicative of damage to said switch during the failure, opening said switch to disable said port.

6. The system of claim 1, said processing element comprising a processing element programmed for:
responsive to occurrence of a persistent failure, disabling one or more power ports along a pathway between each power source and said persistent failure, leaving only processing elements powered in nodes directly connected to power sources and in nodes linked to power sources via power ports that remain enabled;
each powered processing element attempting to enable any disabled load ports;
responsive to successful enablement of disabled load ports, each powered processing element attempting to enable any disabled power ports, initially with a current threshold temporarily reduced from a typical current threshold, which temporarily-reduced current threshold remains above a current needed to power a processing element at any neighboring node connected to a disabled power port and, after a period of time that is less than an expected boot time of a processing element at said neighboring node, returning said temporarily-reduced current threshold to said typical current threshold;
wherein, if a power line leading from an enabled port having said temporarily-reduced current threshold to the neighboring node contains a fault, said fault draws current in excess of said temporarily-reduced current threshold so that the enabled port having said temporarily-reduced current threshold is again disabled before any other nodes disable any power ports having said typical current threshold;
wherein, if a power line leading from an enabled port to the neighboring node is intact, said neighboring processing element detects that it has received power on one of its power ports and initiates a recovery procedure; and
restoring full system function up to the location of the failure.

7. The system of claim 1, further comprising a voltage monitor for monitoring a voltage differential across said switch, wherein a voltage comparator compares a measured voltage differential to a threshold voltage differential, wherein if said measured voltage differential across said at least one switch exceeds said threshold voltage differential, said voltage comparator sends a zero value to said AND gate, opening said at least one switch and disabling said at least one port.

8. The system of claim 7, further comprising a capacitor leading from system voltage to ground so that said voltage monitor in port monitors immediately adjacent to a point of failure detects an excessive voltage differential before said voltage monitor in port monitors further from a point of failure so that nodes further from said point of failure are shielded from an initial rise in current following said failure.

9. A power distribution system having an integrated communication network comprising:
a plurality of nodes connected in a topology that enables current to flow bi-directionally between said nodes, said nodes additionally serviced by communication links therebetween for conducting data bi-directionally between said nodes;
each node comprising:
at least one port and an associated port monitor for measuring current flow into and out of said port; and
a processing element, wherein said processing element and port monitor analyze the measured current to detect one or more fault conditions and, responsive to detection of said one or more fault conditions, reversibly disable said port;
wherein said processing element comprises a processing element programmed for:
monitoring data received over at least one data port;
if data received from a neighboring node is zero-valued for a predetermined period of time, inferring the presence of a short in the communication link connecting to the neighboring node and disabling said data port.

10. The system of claim 9, wherein said at least one port comprises any of:
at least one power port for routing at least one power line;
at least one data port for routing at least one data link; and
at least one load port for routing at least one load line;
wherein said associated port monitor comprises a port monitor associated with each of said at least one power port and said at least one load port.

11. The system of claim 9, wherein:
a user manually instructs one node to enable its power ports so that power distribution is restored after a temporary failure; and
neighboring nodes enable their power ports in response to said enablement by manual instruction from a user, so that said system recovers in an outward direction from said node instructed to enable its associated power ports by said user.

12. The system of claim 9, said processing element comprising a processing element programmed for:
responsive to a determination that a voltage differential between a port and ground at said disabled port matches a system voltage, inferring that a power line leading to said disabled port is free of a short to ground; and
enabling said disabled power port.

13. The system of claim 9, wherein said topology comprises one of:
a loop topology;
a mesh topology; and
a network containing more than one power source;
wherein said bidirectional power and data flow ensures that power and data reaches all nodes in said system if a power line or communications link is shorted or damaged.

14. The system of claim 9, wherein one or more nodes are connected to an outside network and wherein said one or more nodes report locations of system failures to said outside network.

15. The system of claim 9, wherein one or more nodes:
report diagnostics for connected devices;
detect a device failure by monitoring current drawn by a device.

16. The system of claim 9, wherein said port monitor further comprises:
a switch that is closed under normal operation and, when open, disables said associated port;
a voltage monitor for measuring a voltage differential between said associated port and ground to verify operation of said switch.

17. The system of claim 9, wherein said processing element is coupled to an uninterruptible power source, allowing it to re-enable a previously-disabled port.

18. The system of claim 9, further comprising:
at least one load connected to at least one of said plurality of nodes by means of at least one load line; and
at least one power source connected at one of said at least one node by at least one power line.

19. A power distribution system having an integrated communication network comprising:
a plurality of nodes connected in a topology that enables current to flow bi-directionally between said nodes, said nodes additionally serviced by communication links therebetween for conducting data bi-directionally between said nodes;
each node comprising:
at least one port and an associated port monitor for measuring current flow into and out of said port; and
a processing element, wherein said processing element and port monitor analyze the measured current to detect one or more fault conditions and, responsive to detection of said one or more fault conditions, reversibly disable said port;
wherein said port monitor comprises:
a switch that is closed under normal operation and, when open, disables said associated port;
a voltage monitor for measuring a voltage differential across said at least one switch;
a voltage comparator for comparing a value of said voltage differential against a threshold value; and
wherein said switch is controlled by an AND gate such that said switch is closed only upon positive input to said AND gate from both said processing element and said voltage comparator, so that said port is disabled either locally by said port monitor or remotely by said processing element.

20. A power distribution system having an integrated communication network comprising:
a plurality of nodes connected in a topology that enables current to flow bi-directionally between said nodes, said nodes additionally serviced by communication links therebetween for conducting data bi-directionally between said nodes;
each node comprising:
at least one port and an associated port monitor for measuring current flow into and out of said port;
a processing element, wherein said processing element and port monitor analyze the measured current to detect one or more fault conditions and, responsive to detection of said one or more fault conditions, reversibly disable said port;
at least one load connected to at least one of said plurality of nodes by means of at least one load line; and
at least one power source connected at one of said at least one node by at least one power line;
wherein each of said at least one power line and said at least one load line comprises one of:
a single wire; and
a pair of wires that includes a ground reference wire; and
wherein each communication link comprises one of:
a pair of wires over which data is transmitted in the form of a voltage differential between the wires; and
at least one fiber optic cable.

21. In a power distribution system having an integrated communication network, a method for minimizing loss of function due to fault conditions, comprising the steps of:
connecting a plurality of nodes in a topology that enables current to flow bi-directionally between said nodes;
conducting data bi-directionally between said nodes by means of communication links there between;
measuring current flow into and out of at least one port on said node by means of a port monitor; and
at least one processing element and said port monitor analyzing the measured current to detect one or more fault conditions;
responsive to detection of said one or more fault conditions, reversibly disabling said port;
wherein said port monitor comprises:
a switch that is closed under normal operation and, when open, disables said port;
a current monitor for measuring current flowing into or out of said associated port; and
a comparator for comparing a value of said measured current against a threshold value;
wherein said switch is controlled by an AND gate such that said switch is closed only upon positive input to said AND gate from both said processing element and said comparator, so that said port is disabled either locally by said port monitor or remotely by said processing element.

22. The method of claim 21, further comprising the steps of:
said at least one processing element varying said threshold value for port monitors associated with load ports over time by any of:
said at least one processing element ramping said threshold value down from an initial value; and
said at least one processing element following a function that characterizes activation behavior of a particular device.

23. The method of claim 22, further comprising the steps of:
said at least one processing element passing and receiving current measurements over said communication links to and from at least one neighboring node;
said at least one processing element detecting at least one fault condition by comparing current measurements at said associated port with current measurements received from at least one of said at least one neighboring node; and
said at least one processing element disabling any port associated with said at least one fault condition by sending a zero value to said AND gate.

24. The method of claim 22, further comprising the step of:
responsive to one or more ports having been disabled, said processing element attempting to re-establish power flow to and from adjacent nodes by closing switches within port monitors associated with any disabled power ports, wherein as each switch is closed, said current monitor monitors current flowing through its associated port, and wherein if said current remains below a specified threshold, said at least one switch is kept closed, and wherein, if said current exceeds said specified threshold, said at least one port is again disabled.

25. The method of claim 24, further comprising any of the steps of:

said at least one processing element triggering successive attempts at enabling at least one of said disabled ports by means of a timer;

said at least one processing element limiting a number of attempts at enabling said at least one of said disabled ports by means of a counter;

responsive to successful enabling of any disabled power ports, said at least one processing element enabling disabled load ports; and responsive to closure of each switch, said at least one processing element comparing a voltage differential between an associated port and ground to a system voltage, wherein said voltage differential in conjunction with said measured current is used to detect a high-resistance condition across the switch and, responsive to detection of said high-resistance condition, indicative of damage to said switch during the failure, opening said switch to disable said port.

26. The method of claim 22, further comprising the steps of:

responsive to occurrence of a persistent failure, said at least one processing element disabling one or more power ports along a pathway between each power source and said persistent failure, leaving only processing elements powered in nodes directly connected to power sources and in nodes linked to power sources via power ports that remain enabled;

each powered processing element attempting to enable any disabled load ports;

responsive to successful enablement of disabled load ports, each powered processing element attempting to enable any disabled power ports, initially with a current threshold temporarily reduced from a typical current threshold, which temporarily-reduced current threshold remains above a current needed to power a processing element at any neighboring node connected to a disabled power port and, after a period of time that is less than an expected boot time of a processing element at said neighboring node, returning said temporarily-reduced current threshold to said typical current threshold;

wherein, if a power line leading from an enabled port having said temporarily-reduced current threshold to the neighboring node contains a fault, said fault draws current in excess of said temporarily-reduced current threshold so that the enabled port having said temporarily-reduced current threshold is again disabled before any other nodes disable any power ports having said typical current threshold;

wherein, if a power line leading from an enabled port to the neighboring node is intact, a neighboring processing element detects that it has received power on one of its power ports and initiates a recovery procedure; and restoring full system function up to the location of the failure.

27. The method of claim 22, further comprising the steps of:

a voltage monitor monitoring a voltage differential across said switch; and a voltage comparator comparing a measured voltage differential to a threshold voltage differential, wherein if said measured voltage differential across said at least one switch exceeds said threshold voltage differential, said voltage comparator sends a zero value to said AND gate, opening said at least one switch and disabling said at least one port.

28. The method of claim 27, wherein a capacitor leading from system voltage to ground allows voltage monitors in port monitors immediately adjacent to a point of failure to detect an excessive voltage differential before voltage monitors in port monitors further from a point of failure so that nodes further from said point of failure are shielded from an initial rise in current following said failure.

29. In a power distribution system having an integrated communication network, a method for minimizing loss of function due to fault conditions, comprising the steps of:

connecting a plurality of nodes in a topology that enables current to flow bi-directionally between said nodes;

conducting data bi-directionally between said nodes by means of communication links there between;

measuring current flow into and out of at least one port on said node by means of a port monitor; and at least one processing element and said port monitor analyzing the measured current to detect one or more fault conditions;

responsive to detection of said one or more fault conditions, reversibly disabling said port;

said at least one processing element monitoring data received over at least one data port;

if data received from a neighboring node is zero-valued for a predetermined period of time, said at least one processing element inferring the presence of a short in the communication link connecting to the neighboring node and disabling said data port.

30. The method of claim 29, wherein said at least one port comprises any of:

at least one power port for routing at least one power line;

at least one data port for routing at least one data link; and at least one load port for routing at least one load line;

wherein said associated port monitor comprises a port monitor associated with each of said at least one power port and said at least one load port.

31. The method of claim 29, further comprising the steps of:

a user manually instructing one node to enable its power ports to restore power distribution after a temporary failure; and neighboring nodes enabling their power ports in response to said enablement by manual instruction from a user, so that said system recovers in an outward direction from said node instructed to enable its associated power ports by said user.

32. The method of claim 29, further comprising the steps of:

responsive to a determination that a voltage differential between a port and ground at said disabled port matches a system voltage, said at least one processing element inferring that a power line leading to said disabled port is free of a short to ground; and said at least one processing element enabling said disabled power port.

33. The method of claim 29, wherein said topology comprises one of:

a loop topology;

a mesh topology; and a network containing more than one power source;

wherein said bidirectional power and data flow ensures that power and data reaches all nodes in said system if a power line or communications link is shorted or damaged.

34. The method of claim 29, further comprising the steps of:

connecting one or more nodes to an outside network; and said one or more nodes reporting locations of system failures to said outside network.

35. The method of claim 29, further comprising the steps of:
   one or more nodes reporting diagnostics for connected devices;
   said one or more nodes detecting a device failure by monitoring current drawn by said device.

36. The method of claim 29, wherein said port monitor further comprises:
   a switch that is closed under normal operation and, when open, disables said associated port;
   a voltage monitor for measuring a voltage differential between said associated port and ground to verify operation of said switch.

37. The method of claim 29, wherein said processing element is coupled to an uninterruptible power source, allowing it to re-enable a previously-disabled port.

38. The method of claim 29, further comprising the steps of:
   connecting at least one load to at least one of said plurality of nodes by means of at least one load line; and
   connecting at least one power source at one of said at least one node by at least one power line.

39. In a power distribution system having an integrated communication network, a method for minimizing loss of function due to fault conditions, comprising the steps of:
   connecting a plurality of nodes in a topology that enables current to flow bi-directionally between said nodes;
   conducting data bi-directionally between said nodes by means of communication links there between;
   measuring current flow into and out of at least one port on said node by means of a port monitor; and
   at least one processing element and said port monitor analyzing the measured current to detect one or more fault conditions; and,
   responsive to detection of said one or more fault conditions, reversibly disabling said port;
   wherein said port monitor further comprises:
   a switch that is closed under normal operation and, when open, disables said associated port;
   a voltage monitor for measuring a voltage differential across said at least one switch;
   a voltage comparator for comparing a value of said voltage differential against a threshold value; and
   wherein said switch is controlled by an AND gate such that said switch is closed only upon positive input to said AND gate from both said processing element and said voltage comparator, so that said port is disabled either locally by said port monitor or remotely by said processing element.

40. In a power distribution system having an integrated communication network, a method for minimizing loss of function due to fault conditions, comprising the steps of:
   connecting a plurality of nodes in a topology that enables current to flow bi-directionally between said nodes;
   conducting data bi-directionally between said nodes by means of communication links there between;
   measuring current flow into and out of at least one port on said node by means of a port monitor; and
   at least one processing element and said port monitor analyzing the measured current to detect one or more fault conditions;
   responsive to detection of said one or more fault conditions, reversibly disabling said port;
   connecting at least one load to at least one of said plurality of nodes by means of at least one load line; and
   connecting at least one power source at one of said at least one node by at least one power line,
   wherein each of said at least one power line and said at least one load line comprises one of:
   a single wire; and
   a pair of wires that includes a ground reference wire; and
   wherein each communication link comprises one of:
   a pair of wires over which data is transmitted in the form of a voltage differential between the wires; and
   at least one fiber optic cable.

* * * * *